United States Patent [19]

Kimata

[11] Patent Number: 4,652,925

[45] Date of Patent: Mar. 24, 1987

[54] SOLID STATE IMAGING DEVICE

[75] Inventor: Masafumi Kimata, Itami, Japan

[73] Assignee: Mitsubishi Denki Kabushiki Kaisha, Tokyo, Japan

[21] Appl. No.: 698,521

[22] Filed: Feb. 5, 1985

[30] Foreign Application Priority Data

Mar. 1, 1984 [JP] Japan .................................. 59-40768

[51] Int. Cl.⁴ ............................................. H04N 3/14
[52] U.S. Cl. ....................................... 358/213; 357/24
[58] Field of Search ....................... 358/213, 212, 209; 357/24 LR; 377/63; 250/578

[56] References Cited

U.S. PATENT DOCUMENTS

| | | | |
|---|---|---|---|
| 4,322,753 | 3/1982 | Ishihara | 358/213 |
| 4,336,556 | 6/1982 | Sekine et al. | 358/213 |
| 4,447,735 | 5/1984 | Horii | 250/578 |
| 4,489,423 | 12/1984 | Suzuki | 357/24 LR |
| 4,553,167 | 11/1985 | Kinoshita | 358/212 |
| 4,559,550 | 12/1985 | Koike et al. | 357/24 LR |

FOREIGN PATENT DOCUMENTS

| | | |
|---|---|---|
| 3226732 | 2/1983 | Fed. Rep. of Germany . |
| 3243565 | 6/1983 | Fed. Rep. of Germany . |
| 3329095 | 2/1984 | Fed. Rep. of Germany . |

OTHER PUBLICATIONS

Hobson, Geoffrey Stanley, *Charge-Transfer Devices*, Edward Arnold, London, 1978, pp. 18-27.

"The Resistive Gate CTD Area-Image Sensor", by Hendrik Heyns and J. G. Van Santen, IEEE Transactions on Electron Devices, vol. ED-25, No. 2, Feb. 1978, pp. 135-139.

"A New Organization Area Image Sensor with CCD Readout through Priming Transfer", Terakawa et al, IEEE Electron Device Letters, vol. EDL-1, No. 5, May 1980, pp. 86-88.

"Platinum Silicide Schottky-Barrier IR-CCD Image Sensors", Proceedings of the 13th Conference on Solid State Devices, Tokyo, 1981, Japanese Journal of Applied Physics, vol. 21, (1982 Supplement 21-1, pp. 231-235—Kimata et al.

*Primary Examiner*—Gene Z. Rubinson
*Assistant Examiner*—Stephen Brinich
*Attorney, Agent, or Firm*—Lowe Price Leblanc Becker & Shur

[57] ABSTRACT

A solid state imaging device comprises a plurality of photodetectors (111 to 149) disposed two-dimensionally on a semiconductor substrate and a plurality of vertical charge transfer devices (411 to 431 and 511 to 528). Transfer gates (211 to 249) are provided in association with the respective photodetector (111 to 149) and the respective vertical charge transfer devices so as to be disposed therebetween. The transfer gates (211 to 249) are electrically connected for each group of three transfer gates in a horizontal direction, a driving signal being applied selectively to each group from a scanning circuit (300). Accordingly, by means of one of the groups of the transfer gates (211 to 249), to which a driving signal is selectively applied from the scanning circuit (300), a signal charge generated in the corresponding ones of the photodetectors (111 to 149) is transferred to the vertical charge transfer devices (411 to 431 and 511 to 528). By means of the vertical charge transfer devices (411 to 431 and 511 to 528), a signal charge in an arbitrary row is transferred to a horizontal charge transfer device through storage gates (610, 620 and 630). Consequently, for each vertical transfer, only a signal charge corresponding to one picture element is contained in a vertical line and accordingly if overflow of a signal charge occurs, a blooming phenomenon will never occur.

7 Claims, 4 Drawing Figures

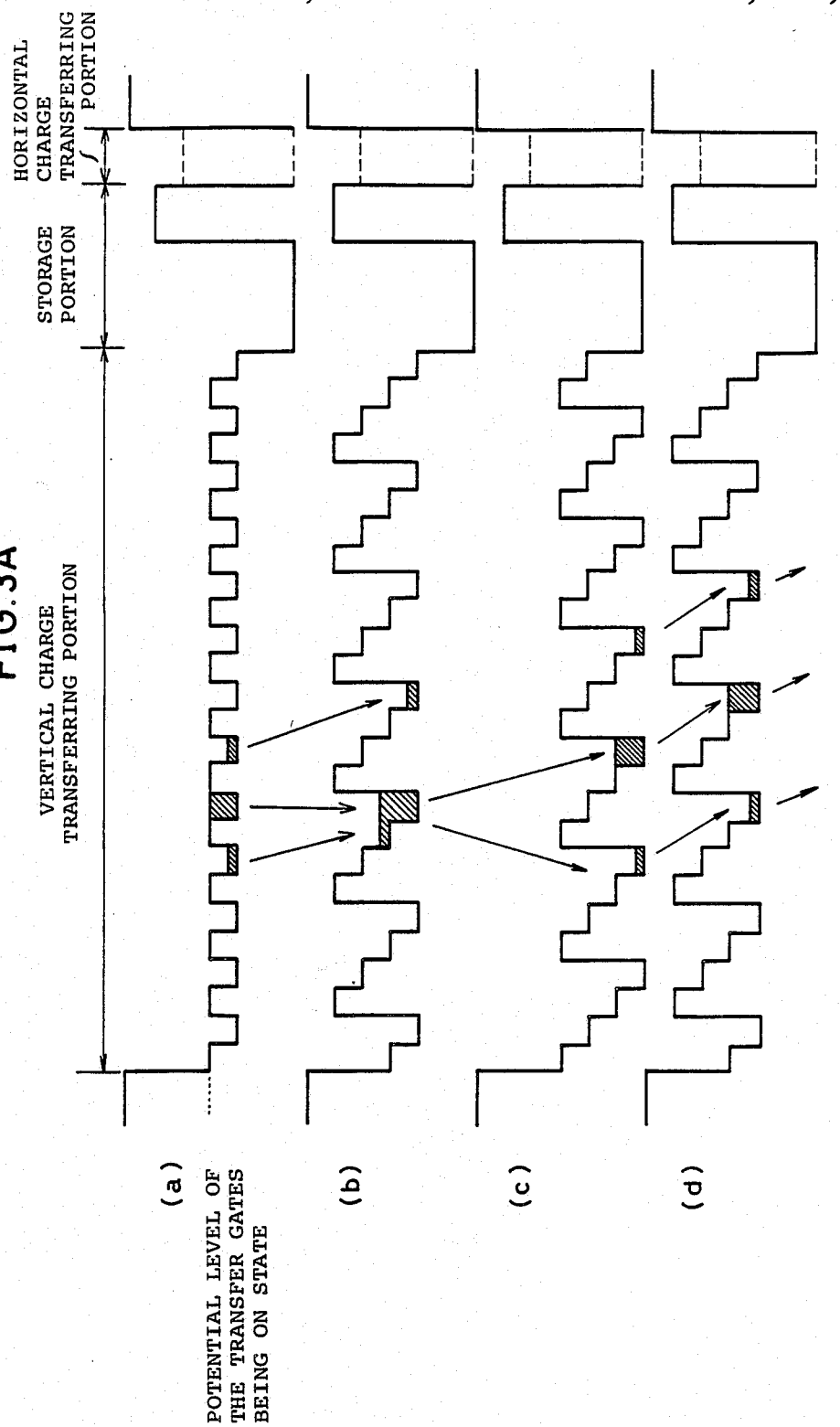

SOLID STATE IMAGING DEVICE

BACKGROUND OF THE INVENTION

1. Field of the Invention

The present invention relates to a solid state imaging device of a charge transfer type and particularly to a two-dimensional solid state imaging device having distinctive features in a scanning mechanism for readout of signals.

2. Description of the Prior Art

Generally, a solid state imaging device comprises photodetectors and a scanning mechanism on a semiconductor material such as silicon, so that imaging of light from a visual range to an infrared range can be made if the photodetectors are suitably selected. As compared with a conventional imaging device structured by electron tubes, a solid state imaging device has advantages in that it has a small size and a light weight with high reliability and that the portions to be adjusted at the time of manufacturing and assembling an imaging apparatus are considerably decreased. For this reason, solid state imaging devices have attracted special interest in a wide range of technical fields.

Solid state imaging devices are roughly classified, according to the scanning systems, into two types: an XY address type and a charge transfer type. Conventionally, devices of the XY address type are typically represented as devices using MOS switches and devices of the charge transfer type are typically represented as devices using CCDs (charge coupled devices).

However, the former devices using MOS switches have a problem in that they cannot be used for detection of a very small signal requiring a high S/N ratio. In such a device, spike noise is generated when a MOS switch turns on for reading of a signal. This spike noise is mixed in a detected signal to lower the S/N ratio of the detected signal. Furthermore, the generated spike noise differs dependently on the rows for reading and as a result, a noise called a fixed pattern noise is generated, which further lowers the S/N ratio of the detected signal.

On the other hand, in the latter devices using CCD, particularly in a device of an interline transfer system widely utilized recently since photodetectors can be selected in an arbitrary manner as in the previously stated MOS system, the area of the CCD portion for transfer is preferably designed to be as small as possible. This is because in this device, where CCDs for transfer are disposed between the lines of the photodetectors, it is desired to enlarge the effective area of the photodetectors in order to improve the imaging performance. However, it is known that the charge transfer capacity of CCD is proportional to the storage gate area for one row of CCDs assuming that the CCDs have the same structure. Accordingly, if the area of the CCD portion for transfer is made small, there is a problem that the maximum value of the charge to be transferred has to be limited on the other side.

For example, in "Platinum Silicide Schottky-Barrier IR-CCD Image Sensors" by M. Kimata et al. in JJAP, Vol. 21 (1982) Suppl.21-1, it is indicated that in conventional image sensors of the interline transfer system, a dynamic range is limited by the charge transfer capacity of the vertical CCDs.

These problems become serious particularly in such devices as infrared rays solid state imaging devices in which a small signal in a large background is to be detected.

SUMMARY OF THE INVENTION

A primary object of the present invention is to provide a solid state imaging device with low noise having capacity of a large signal charge amount.

Briefly stated, the present invention comprises a solid state imaging device including photodetectors dispose two-dimensionally, in which transfer gates for controlling the transfer of a signal charge from the photodetectors to vertical charge transfer devices are electrically connected for each group of a prescribed plural number of transfer gates. The above described solid state imaging device comprises a scanning circuit for successively selecting the respective groups of transfer gates, by which control is made to read out only a signal of one picture element simultaneously from one vertical line of vertical charge transfer devices.

Consequently, according to the present invention, a signal charge may be applied in a manner extending over a plurality of rows of vertical charge transfer CCDs. As a result, if the proportion of the area of the CCDs is made small, it is not needed to impose limitation on the maximum value of the signal charge amount to be transferred, which makes it possible to provide a device having capacity of a large signal charge amount. In addition, since a charge transfer system essentially having little noise is adopted, noise such as in the MOS system is not generated in a solid state imaging device in accordance with the present invention.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are charts showing potentials in relation to the portions in FIG. 2 for the purpose of explaining the operation of the above described embodiment.

DESCRIPTION OF THE PREFERRED EMBODIMENTS

Figure 1:
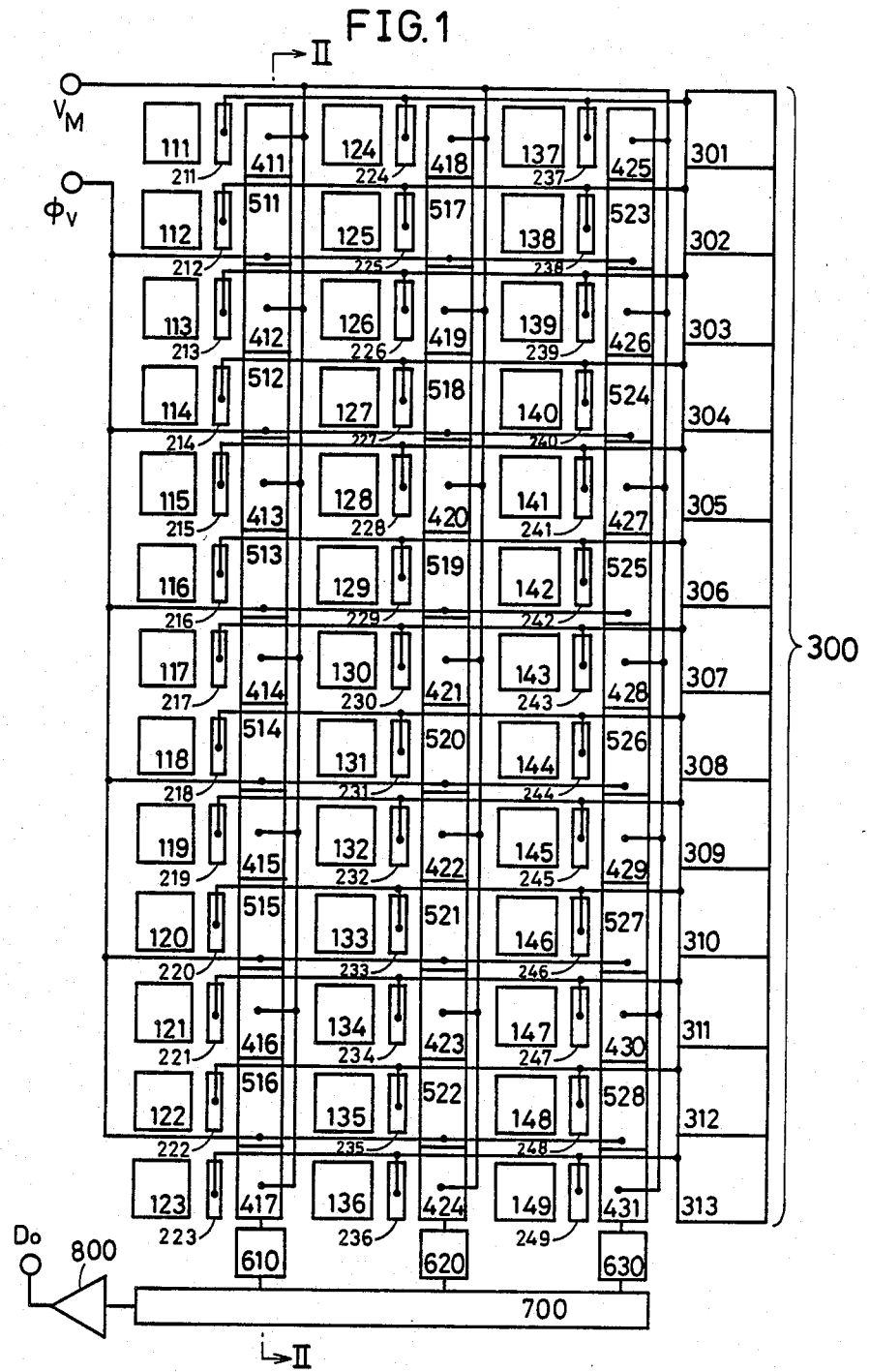
FIG. 1 is a block diagram showing a plane structure of an embodiment of the present invention.

FIG. 1 is a block diagram showing a plane structure of an embodiment of the present invention. This embodiment is assumed to have an array of photodetectors of 3×13 for the purpose of facilitating the explanation.

Referring to FIG. 1, the blocks designated by the reference numerals 111 to 149 are photodetectors, which are structured by detectors of any type selected among a PN junction type, an MIS structure type, a Schottky-barrier type and the like. The blocks designated by the reference numerals 211 to 249 are transfer gates, which control the transfer of a signal from the photodetectors 111 to 149 to the vertical charge transfer devices 411 to 431 and 511 to 528. The transfer gates 211 to 249 are electrically connected for each group of transfer gates aligned in a horizontal direction (for example, transfer gates 211, 224 and 237) and the respective groups of transfer gates are connected to the prescribed blocks of the scanning circuit 300. The scanning circuit 300 includes 13 blocks designated by the reference numerals 301 to 313, each block being connected to the associated group of horizontally aligned transfer gates described above (for example, the block 301 of the scanning circuit being connected to the transfer gates 211, 224 and 237, the block 302 of the scanning circuit being connected to the transfer gates 212, 225 and 238 and subsequently connection being made in the same manner). To the respective groups of horizontally aligned transfer gates, a signal is applied from the associated blocks of the scanning circuit 300.

The gates 411 to 431 forming the vertical charge transfer devices on one side are electrically connected with each other, a signal $V_M$ being applied thereto. The gates 511 to 528 forming the vertical charge transfer devices on the other side are also electrically connected with each other, a signal $\phi_V$ being applied thereto. The signal $\phi_V$ is a transfer clock signal for transferring a signal detected by the phtodetector 111 to 149 through the gates 411 to 431 and 511 to 528. The signal $V_M$ is a DC voltage signal having a medium value of the amplitude of the transfer clock signal $\phi_V$.

In a lower portion of the array, storage portions 610, 620 and 630 are provided for the purpose of temporarily storing the signal charge transferred through the vertical charge transfer devices. The storage portions 610, 620 and 630 are connected respectively to the transfer devices 417, 424 and 431 situated in the lowermost portions of the three vertical lines of vertical charge transfer devices.

The storage portions 610, 620 and 630 perform not only the above described storing function but also the function of controlling the transfer of a signal charge from the vertical charge transfer devices 417, 424 and 431 to a horizontal charge transfer device 700.

The structure and the operation of an output preamplifier 800 connected to the horizontal charge transfer device 700 and to an output terminal thereof are the same as the structure and the operation of a conventional image sensor (solid state imaging device) using CCDs, which have been already explained in many documents. Therefore, the description thereof is omitted in this specification.

Figure 2:
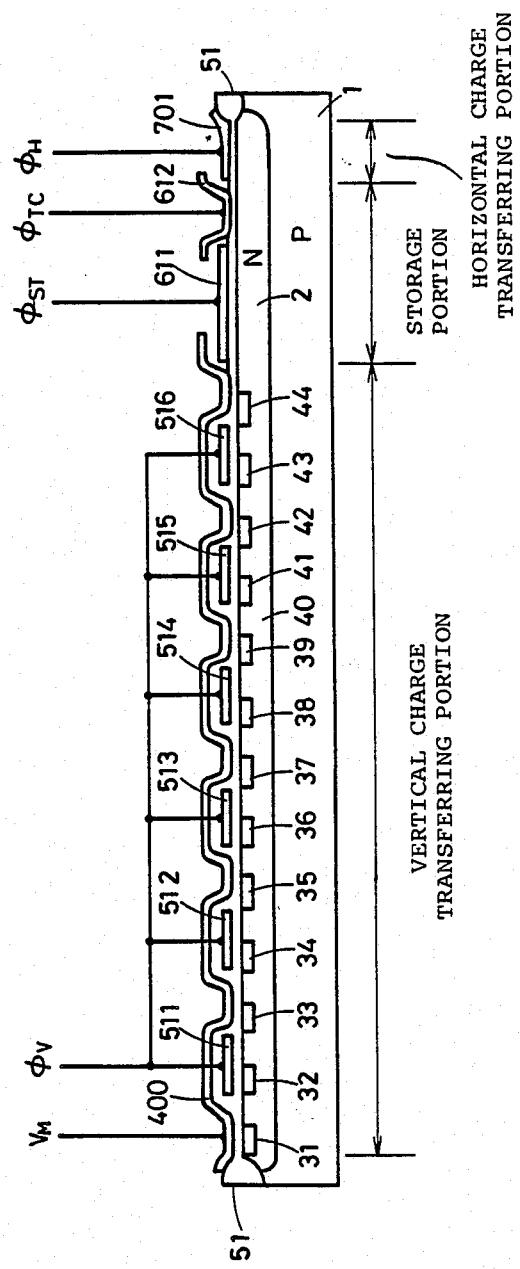
FIG. 2 is a view showing a sectional structure viewed along the line II—II in FIG. 1.

FIG. 2 is a sectional view taken along the line II—II in FIG. 1. The sectional view of FIG. 2 shows an example of a structure of two layers of polysilicon.

Referring to FIG. 2, the reference numeral 1 designates a silicon substrate, which is a p-type substrate if electrons are utilized for transferring a signal charge, namely, if n channel is applied. The reference numeral 2 designates a well of n-type impurity assigned for forming buried channel serving as channel region. In upper portions of the well 2, impurity regions 31 to 44 forming potential barriers are provided at almost equal intervals and gate electrodes 400 and 511 to 516 are provided over these regions. The impurity regions 31 to 44 have impurity concentration lower than that of the n-type impurity well region 2. The gate electrodes 511 to 516 correspond to the gates 511 to 516 shown in FIG. 1 and are formed of the first polysilicon layer. The gate electrode 400 corresponds to the gates 411 to 417 and are formed of the second polysilicon layer. The gate electrode 400 is represented in the plane view of FIG. 1 as the structurally individual blocks 411 to 417 which are electrically connected with each other, while in the sectional view of FIG. 2, the gate electrode 400 is represented as a structurally and electrically continual region formed of the second polysilicon layer and is designated by the single reference numeral 400.

The reference numeral 611 designates a storage gate electrode and the reference numeral 612 designates a control gate electrode for controlling the transfer of a signal from the storage gate into the horizontal charge transfer device 700. The storage portion 610 is structured by a region including the storage gate electrode 611 and the control gate electrode 612. A gate electrode designated by the reference numeral 701 is a gate electrode included in the horizontal charge transfer device 700 (see FIG. 1). A thick oxide film 51 is provided for separation of the devices.

Now, the operation of this embodiment will be described in the following.

Figure 3B:
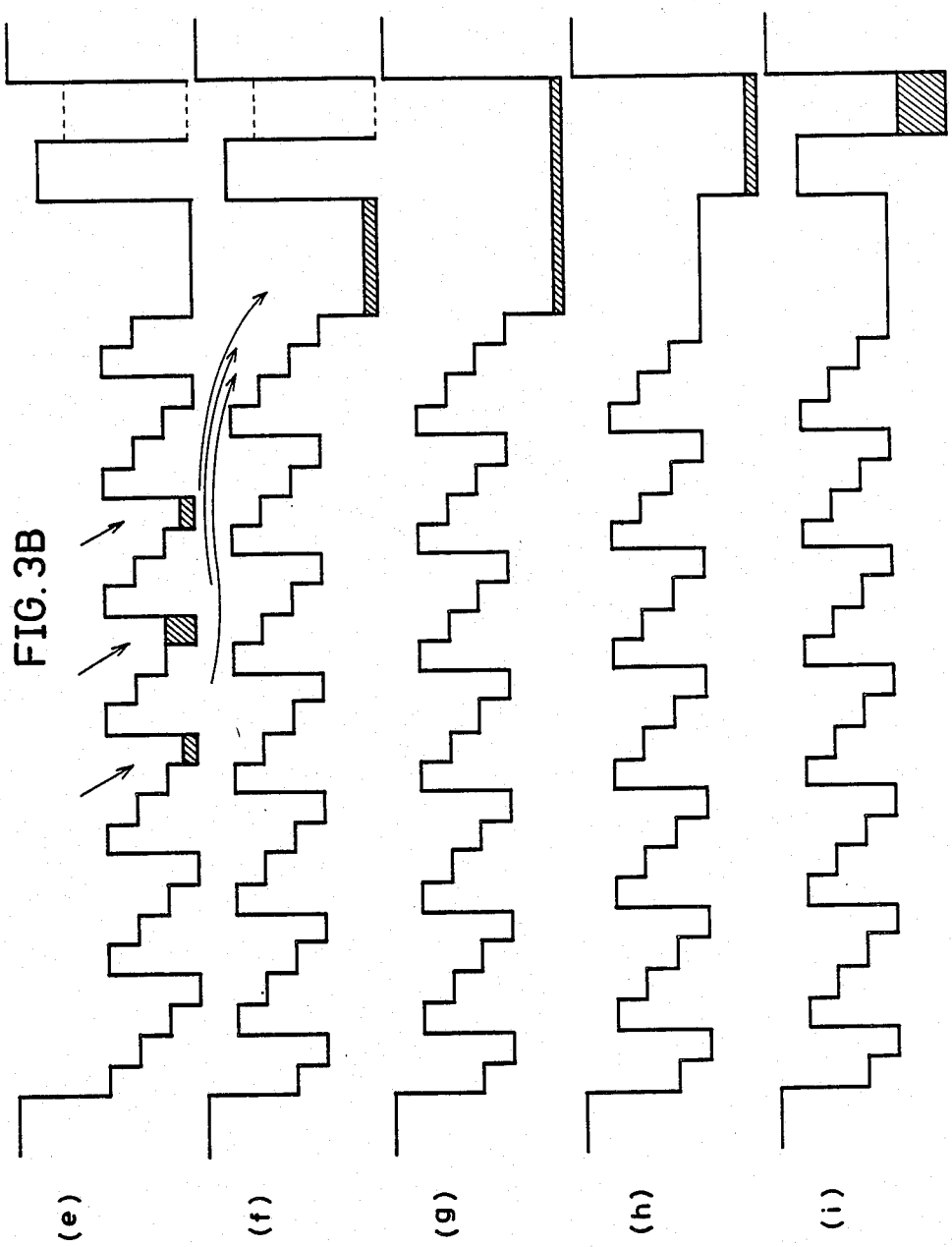

For the purpose of explaining the operation of this embodiment, changes in the potential state in the well region 2 are shown in (a) to (i) of FIGS. 3A and 3B. More specifically, reference characters (a) to (i) as shown as FIGS. 3A and 3B, according to the changes of the transferred clock signal $\phi_V$ applied to the gate electrodes 511 to 516, the potential state under the gate electrodes changes successively.

In this embodiment, the signal $V_M$ is set to a medium level between the high level $\phi_V$ and the low level of the transferred clock signal $\phi_V$. In such a state, first, the level of the clock signal $\phi_V$ is made to be the same level as that of the signal $V_M$ and then the scanning circuit 300 for selection of transfer gates is enabled so that one group of transfer gates is turned on. For example, by the block 305 of the scanning circuit 300, the group of transfer gates 215, 228 and 241 are turned on. The reference character (a) of FIG. 3A shows potential in the well 2 in this ON state.

The transfer gates are surface channel and even if they are in the ON state, the potential level thereof is made shallower than in the potential barriers for vertical charge transfer as shown as (a) in FIG. 3A. As a result, if a signal to be transferred from a detector for one vertical line, for example, from the detector 115 to the vertical charge transfer devices has a large amount, the signal is received in a plurality of potential wells as shown by the shadowed portions. This point constitutes one of the distinctive features of this embodiment which can be observed as compared with a solid state imaging device of a conventional interline transfer system.

More specifically, in a conventional interline transfer system, since a signal is received in a plurality of potential wells in such ON state, overflow of the signal occurs, causing a blooming phenomenon. On the contrary, in this embodiment, only a signal amount corresponding to one picture element is contained for one vertical line of vertical charge transfer devices in the same period of time and therefore a blooming phenomenon does not occur. Since 13 rows of detectors are arrayed in a vertical direction in this embodiment, it is necessary to make the same scanning control for the respective detectors arrayed vertically. This scanning control can be made without any difficulty if transfer of the charge in one detector is completed in one horizontal period by selecting a suitable cycle for the transfer clock signal $\phi_V$.

When the transfer clock signal $\phi_V$ becomes in the high level from the potential state shown as (a) in FIG. 3A with the signal $V_M$ being unchanged, the potential states becomes as shown as (b) in FIG. 3A. Furthermore, if the transfer clock signal $\phi_V$ becomes in the low level, a potential state as shown as (c) in FIG. 3A is established, and division of the charge is made so that an amount represented as the maximum charge transfer amount in the conventional CCD operation becomes equal to the maximum signal charge of one time of transferring.

After that, the potential state changes successively according to the changes of the clock signal $\phi_V$ from the high level to the low level and to the high level as shown as (d) and (e) in FIGS. 3A and 3B in the same manner as in the conventional CCD transfer operation, whereby the signal charge is transferred to the storage portion 610.

When transfer is made at least for the number of times corresponding to the number of gates of the vertical charge transfer devices, all the signal charges in the vertical charge transfer devices are collected under the storage gate electrode 611 as shown as (f) in FIG. 3B. More specifically, in a conventional interline transfer system, output of one picture element is transferred in one row of CCDs, while in this embodiment, only a signal for one picture element is transferred at a time in one vertical line. As a result, if the transfer signal charge extends over a plurality of rows of CCDs, the extending signal charges are collected in the storage gate 611 of a sufficient capacity provided outside the array. Accordingly, a blooming phenomenon does not occur and the maximum signal amount to be processed can be remarkably increased as compared with the conventional interline transfer system. This point is one of the distinctive features of the embodiment.

After the signal charges are collected under the storage gate electrode 611, the control gate 612 is made to be the high level and the horizontal charge transfer gate 701 is made to be the high level. As a result, the potential state becomes as shown as (g) in FIG. 3B. After that, the storage gate 611 and the control gate 612 are made to be the low level and the potential state changes as shown as (h) and (i) in FIG. 3B. In consequence, the signal charge is transferred to the horizontal charge transfer device 700.

During the changes as shown as (a) to (f) in FIGS. 3A to 3B, the horizontal charge transfer device 700 completes horizontal transfer of the previously transferred signal of one horizontal line. The changes of the potential state as shown as (g) to (i) in FIG. 3B are made during a horizontal blanking period after the readout of the above described horizontal line. Then, the horizontal charge device 700 is enabled to read out the signal charge and at the same time, the potential state in the vertical transfer devices and the storage portion 610 returns to the state shown as (a) in FIG. 3A, so that the transfer gate selecting scanning circuit 300 is enabled to read out a picture element of the subsequent line and thus the above described operation is repeated.

In the foregoing description, the driving system of the vertical charge transfer devices was a pseudo single-phase driving system as a variant of a two-phase driving system. However, it is not limited thereto and any other system may be employed if it is an ordinary two-phase to four-phase driving system utilized for driving of CCD.

The structure of CCD is not limited to a two-layer polysilicon structure with buried n-channel, and other structure of CCD may be applied.

In addition, in the above described embodiment, the number of picture elements in a vertical direction was equal to the number of vertical aligned gates of the vertical charge transfer devices. However, it is not necessary to make equal these numbers and the same effects of the invention can be obtained if these numbers are not equal.

The present invention may also be applied to a system in which signals of two picture elements are synthesized and read out as in a conventional field storage system. In such a system, to which the present invention is applied, signals for two picture elements may exist simultaneously in the vertical charge transfer devices in a vertical line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solid state imaging device comprising:
   a plurality of photoelectric conversion means disposed two-dimensionally, each constituting a picture element and each picture element generating a signal charge according to the amount of incident light;
   vertical charge transfer means provided in association with said plurality of photoelectric conversion means for vertically transferring said signal charge generated in said photoelectric conversion means;
   a plurality of transfer gate means provided in association with said photoelectric conversion means for controlling a transfer of said signal charge from said photoelectric conversion means to said associated vertical charge transfer means;
   transfer gate connecting means for making electrical connection for a prescribed plural number of said transfer gate means to form two or more groups of transfer gate means, each group comprising said prescribed plural number of transfer gate means;
   scanning circuit means coupled to said vertical charge transfer means and said transfer gate connecting means, said scanning circuit means operating in synchronism with a horizontal synchronizing signal, said scanning circuit means applying selectively a signal to said transfer gate connecting means to enable a prescribed group of transfer gate means so that said signal charge generated in associated photoelectric conversion means may be transferred to said vertical charge transfer means, and said scanning circuit means applying selectively a driving signal to said vertical charge transfer means to vertically transfer said signal charge;
   storage means coupled to said vertical charge transfer means for storing charge therefrom during a horizontal period of said horizontal synchronizing signal; and
   horizontal charge transfer means coupled to said storage means for operating in synchronism with said horizontal synchronizing signal for transferring and providing said signal charge stored in said storage means in a blanking period of said horizontal synchronizing signal.

2. A solid state imaging device in accordance with claim 1, including
   means for transferring from said photoelectric conversion means to said vertical charge transfer means only a signal charge for one picture element in a vertical direction.

3. A solid state imaging device in accordance with claim 1, wherein
   said vertical charge transfer means comprises;
   a plurality of first gate electrodes formed selectively on a semiconductor substrate, and a plurality of second gate electrodes continually formed on said first gate electrodes, an insulating film separating said first and second gate electrodes.

4. A solid state imaging device in accordance with claim 3, wherein
said first gate electrodes and said second gate electrodes are formed of polysilicon.

5. A solid state imaging device in accordance with claim 3, wherein
said scanning circuit means applies a first clock transfer signal to said first gate electrodes and applies a second clock transfer signal to said second gate electrodes.

6. A solid state imaging device in accordance with claim 5, wherein
said second clock transfer signal is a DC voltage signal having a medium value of the amplitude of said first clock transfer signal.

7. A solid state imaging device in accordance with claim 1, wherein
said storage means comprises;
storage gates formed on said semiconductor substrate on which said vertical charge transfer means are formed, an insulating film separating said storage gates and said substrate and
control gates formed adjacent to said storage gates through said insulating film.

* * * * *